(12) United States Patent
Akiba

(10) Patent No.: US 6,188,297 B1
(45) Date of Patent: Feb. 13, 2001

(54) LOW-EMI CIRCUIT BOARD AND LOW-EMI CABLE CONNECTOR

(75) Inventor: Yutaka Akiba, Fujisawa (JP)

(73) Assignee: Hitachi, Ltd., Tokyo (JP)

( * ) Notice: Under 35 U.S.C. 154(b), the term of this patent shall be extended for 0 days.

(21) Appl. No.: 09/202,926

(22) PCT Filed: Jul. 9, 1997

(86) PCT No.: PCT/JP97/02376

§ 371 Date: Dec. 23, 1998

§ 102(e) Date: Dec. 23, 1998

(87) PCT Pub. No.: WO98/02025

PCT Pub. Date: Jan. 15, 1998

(30) Foreign Application Priority Data

Jul. 10, 1996 (JP) .................................................. 8-180863

(51) Int. Cl.[7] .................................. H04B 3/28; H01P 1/26
(52) U.S. Cl. ........................... 333/12; 333/22 R; 333/260
(58) Field of Search .......................... 333/12, 260, 22 R

(56) References Cited

U.S. PATENT DOCUMENTS

| | | | |
|---|---|---|---|
| 3,784,950 | * 1/1974 | Coffman | 338/220 |
| 4,399,419 | * 8/1983 | Dobrovolny | 333/12 |
| 4,795,670 | 1/1989 | Nishigaki et al. | 428/209 |
| 5,491,301 | 2/1996 | Akiba et al. | 174/250 |
| 5,831,495 | * 11/1998 | Hino | 333/202 |

FOREIGN PATENT DOCUMENTS 0 548 663 A1 6/1993 (EP) .

OTHER PUBLICATIONS

"Circulation des courants dans les masses metalliques", S. Marmor, Toute L'Electronique, No. 36, Apr. 1973, p. 89, Fig. 3.

* cited by examiner

Primary Examiner—Benny Lee
Assistant Examiner—Kimberly E Glenn
(74) Attorney, Agent, or Firm—Antonelli, Terry, Stout & Kraus, LLP

(57) ABSTRACT

A low-EMI cable connector mounted on a transmission cable for connecting circuits comprises n (n: 1, 2, . . . ) cylindrical members having arranged on the inner surface of a dielectric portion covering the whole periphery of the transmission cable. A short-circuiting member covering the whole periphery of the transmission cable is formed on the termination side of the cylindrical members thereby to form a short-circuiting termination line. The resonance frequency of the short-circuiting termination line is set equal to the resonance frequency of the transmission cable.

15 Claims, 10 Drawing Sheets

(a)

(b)

(a)

(b)

LOW-EMI CIRCUIT BOARD AND LOW-EMI CABLE CONNECTOR

TECHNICAL FIELD

The present invention relates to a low-EMI circuit board on which circuit elements such as an IC and a LSI are mounted, or more in particular to a low-EMI cable connector for suppressing the unrequired radiation in the low-EMI circuit board and the transmission cable in such a manner as to suppress the radiation mainly of differential mode from the mounted parts.

BACKGROUND ART

Conventionally, in a multilayer circuit board having arranged therein signal lines, a power line and a ground line and having arranged the surface thereof an IC elements, a LSI element and circuits, a serious problem is posed by the fact that with the increase in speed and density, the unrequired radiation is liable to occur due to high harmonics which have an effect on other devices.

The unrequired radiation is roughly divided into two types, the common-mode radiation caused by the resonance due to the potential fluctuations of the power layer and the ground layer and the radiation of differential mode caused by the signal line layers and the component parts mounted. In the prior art, various methods have been proposed to reduce these unrequired radiation.

A method generally employed for reducing the radiation of differential mode is by shielding, and a method specifically employed is by coating a conductive paste containing a resistance material on the surface of the board.

In order to send a signal to the circuit board from an external source, a transmission line such as a coaxial cable is connected by a connector with an external signal source. Such a connection is schematically shown in FIG. 13.

In this diagram, the signal source is designated as a transmitting terminal unit 100 and the circuit board receiving signals from the transmitting terminal unit 100 is designated as a receiving terminal unit 101, with a coaxial cable 102 connected between them. The circuit board constituting the receiving terminal unit 101 is connected to the coaxial cable 102 by a connector not shown. The transmitting terminal unit 100 is also connected with the coaxial cable 102 by a connector not shown.

In the transmitting terminal unit 100, an outward line 100a connected to a signal source 100c for generating a pulse-like signal of frequency $\omega j$ and voltage V0 is connected to an internal conductor 102a of the coaxial cable 102, and an inward line 100b is connected to an external conductor 102b of the coaxial cable 102, each by a connector not shown. Also, the receiving terminal unit 101 is equivalently expressed by a receiving line 110a, a return line 101b and a load impedance ZL connected between them. This receiving line 100a is connected to the internal conductor 102a of the coaxial cable 102, and the inward line 101b is connected to the external conductor 102b of the coaxial cable 102, respectively, by a connector not shown. The inward line 100b of the transmitting terminal unit 100 and the return line 101b in the receiving terminal unit 101 are grounded, and the external conductor 102b of the coaxial cable 102 is used as a grounding line.

In this configuration, a signal line is formed of the outward line 100a from the signal source 100c of the transmitting terminal unit 100, the internal conductor 102a of the coaxial cable 102, the receiving line 101a, the load resistor R, the return line 101b of the receiving terminal unit 101, the external conductor 102b of the coaxial cable 102 and the inward line 100b of the transmitting terminal unit 100.

In this signal line, the signal output from the signal source 100c in the transmitting terminal unit 100 is sent to the internal conductor 102a of the coaxial cable 102 as a voltage V1a and a current i1a, and received at the receiving terminal unit 101 as a voltage V1b and a current i1b, respectively. Also, in the return path of this signal line, a signal of a voltage V2b and a current i2b flows from the receiving terminal unit 101 along the inner surface of the external conductor 102b of the coaxial cable 102. Not only that, the current is reflected by an equivalent impedance at a junction point B between the coaxial cable 102 and the receiving terminal unit 101, so that the current leaks out to the outer surface of the external conductor 102b of the coaxial cable 102. This flows as a leakage current i3b along the outer surface of the external conductor 102b of the coaxial cable 102. The signal flowing along the inner surface of the external conductor 102b is input to the transmitting terminal unit 100 as a voltage V2a and a current i2a. The current is also reflected by an equivalent impedance at a junction point A between the coaxial cable 102 and the transmitting terminal unit 100. As a result, part of the current i2a leaks out to the outer surface of the external conductor 102b of the coaxial cable 102 and flows along the outer surface of the external conductor 102b of the coaxial cable 102 as a leakage current i3a.

The coaxial cable 102 forming this signal line has a resonance point of a wavelength $\lambda$ satisfying the relation $L=(2n-1)\cdot\lambda/4$ (n: a positive integer) where L is the length of the coaxial cable 102. Therefore, as long as the wavelength of the currents i3a, i3b flowing along the outer surface of the external conductor 102b of the coaxial cable 102 is sufficiently away from the wavelength $\lambda$, the currents i3a, i3b which are originally very small pose no problem. In the case where the wavelength of the currents i3a, i3b is proximate to the resonance point of the coaxial cable 102, however, the coaxial cable 102 develops a resonance, operates as a mono-pole antenna, and thus generates an unrequired electromagnetic radiation. Let the length L of the coaxial cable 102 be 1 m, for example. A resonance point occurs at a resonance point of frequency equivalent to odd multiples of $f=3\times10^8/4\times1 = 75$ MHz.

The leakage current described above could be eliminated, if the case of the interior of the transmitting terminal unit 100, the interior of the coaxial cable 102 and the interior of the case of the receiving terminal unit 101 could be completely hermetically closed by integrating the case of the transmitting terminal unit 100 completely with the outer surface of the external conductor 102b of the coaxial cable 102 and also by integrating the case of the receiving terminal unit 101 completely with the outer surface of the external conductor 102b of the coaxial cable 102. Actually, however, such a configuration is substantially impossible to realize. Therefore, the occurrence of the unrequired radiation described above is unavoidable.

In view of this, according to the prior art, in order to suppress the unrequired radiation, a ferrite core 103a called a common mode core or a common mode choke is arranged on the side end of the transmitting terminal unit 100 of the coaxial cable 102, and in similar manner, a ferrite core 103b is arranged on the side end of the receiving terminal unit 101.

The provision of the ferrite cores 103a, 103b is equivalent to the insertion of a series circuit including an inductance and a resistor in the signal line along the outer surface of the external conductor 102b of the coaxial cable 102 due to the inductance and the polarization derived from the ferrite cores 103a, 103b. It follows, therefore, that the leakage currents i3a, i3b flowing along the same outer surface are suppressed. The absolute value of the impedance of the ferrite cores 103a, 103b is conventionally set to about 100Ω from the viewpoint of the material and structure.

According to the above-mentioned conventional method, however, a conductive paste is coated on a comparatively flat portion of the surface of the board but cannot be coated on the component parts mounted or the portion where they are mounted. Even in the case where the board surface is shielded by the conductive paste, therefore, the shield layer is opened in the portion where the component parts are mounted, and the unrequired radiation leaks out from the opening and the unrequired radiation (common mode radiation) occurs anew due to the resonance at the opening. The unrequired radiation thus cannot be suppressed sufficiently.

Also, the unrequired radiation from the transmission line such as a coaxial cable connected to the board, as explained with reference to FIG. 13, can be suppressed to some degree, but not necessarily to a sufficient degree, by arranging a ferrite core at the ends of the transmission line. In the foregoing description with reference to FIG. 13, the absolute value of the impedance of the ferrite cores 103a, 103b is set to 100 Ω. If 100 Ω is not sufficient, however, the absolute value of the impedance is increased by arranging a plurality of ferrite cores 103a and ferrite cores 103b. In this way, the effect of suppressing the leakage currents i3a, i3b can further be increased at the sacrifice of the requirement of using a bulky, heavy ferrite core. The use of a plurality of ferrite, on the other hand, is equivalent to the coils wound in a plurality of turns, between which the electro-static capacitance may occur, thereby posing the problem of the occurrence a new resonance.

A more critical problem is that even when a quality ferrite material is used for the ferrite cores 103a, 103b, the permeability $\mu$ thereof has such a frequency characteristic that the frequency of 300 MHz or higher sharply reduces the permeability $\mu$ and makes it impossible to produce a sufficiently large impedance. At such a frequency, the ferrite cores 103a, 103b have a lesser effect of reducing the leakage currents i3a, i3b, and are unable to suppress the unrequired radiation generated from the coaxial cable 102.

In the case where the clock frequency of the signal involved is as low as about 10 MHz, for example, it is sufficiently lower than 300 MHz and therefore it is possible to use the ferrite cores 103a, 103b with a sufficiently large permeability $\mu$. Thus, the fundamental wave and triple harmonics of the problem leakage currents i3a, i3b causing the unrequired radiation can be sufficiently suppressed, and the frequency characteristic of the permeability $\mu$ is not a serious problem. In recent years, however, the clock frequency of the personal computer or the like has further increased to not less than 100 MHz or not less than 200 MHz, etc. With this high clock frequency, the permeability $\mu$ of the ferrite cores 103a, 103b is decreased to such an extent, at the fundamental wave and the triple harmonics of the signal, that the effect of reducing the unrequired radiation cannot be exhibited.

An object of the present invention is to provide a low-EMI circuit board which obviates the above-mentioned problems and is capable of effectively suppressing the radiation of mainly the differential mode.

Another object of the invention is to provide a low-EMI cable connector which is both compact and simple in configuration and can effectively suppress the unrequired radiation in the signal transmission line.

DISCLOSURE OF INVENTION

In order to achieve the objects mentioned above, in a low-EMI circuit board according to the present invention, the whole surface of the board including the component parts mounted thereon is covered with a shield plate, which is electrically connected to the ground layer with the shield plate inserted therein. As a result, the unrequired radiation of differential mode generated from the component parts mounted and the signal lines is contained between the shield plate and the ground layer and cannot leak out.

Also, the low-EMI circuit board according to the present invention comprises a loss layer on at least one surface of the conduction layer of the shield plate. With the containment of the unrequired radiation of differential mode, a high frequency current flows in the short-circuit loop formed by the shield plate and the ground layer. Then, the resulting resonance causes the unrequired external radiation (common mode radiation). This loss layer attenuates the current and can suppress the unrequired radiation.

Further, in the low-EMI circuit board according to this invention, the portion of the shield plate around the board is connected at multiple points to the ground layer. As a result, the resonance frequency of the loop including the shield plate and the ground layer can be transferred to a high frequency band higher than the frequency region to be suppressed. Thus it is possible to sufficiently suppress the common-mode radiation from the board side with the differential-mode radiation as a noise source.

Further, in the low-EMI circuit board according to this invention, the portion of the shield plate around the board is connected to the ground layer through a matching termination resistor thereby to suppress the potential fluctuations. As a result, the common-mode radiation from the board side is suppressed not to leak out.

Further, in the low-EMI circuit board according to the present invention, the shield plate is connected at multiple points to the ground layer around the component parts mounted on the board such as the LSI element and the drive IC element which are operated at high speed. The fast-operating component parts mounted on the board are liable to develop the differential-mode radiation. By connecting the shield plate to the ground layer at multiple points around the component parts mounted, these component parts are individually shielded. Thus, the radiation of differential mode from these component parts mounted is reduced. Further, in the portion around the board where the shield plate is connected to the ground layer at multiple points, it follows that the electrical connection structure is doubled for shielding. The shielding effect thus becomes conspicuous.

In order to achieve the second object described above, a low-EMI cable connector according to this invention comprises n (n: 1, 2, . . . ) cylindrical members arranged on the inner surface of a dielectric portion surrounding the whole periphery of a transmission cable, wherein a short-circuiting member surrounding the whole periphery of the transmission cable is arranged on the termination side of the cylindrical members thereby to form a short-circuiting termination line, and the resonance frequency of the short-circuiting termination line is configured to equal the resonance frequency of the transmission cable.

Also, in the low-EMI cable connector according to this invention, the length li of the i-th (i: 1, 2, . . . , n) one of the cylindrical members forming the short-circuiting termination line is given as $$l_t = \frac{1}{4} \times \frac{\lambda_i}{\sqrt{\varepsilon_{ri}}} \qquad \text{(Expression 1)}$$

where
 $\lambda_i = c/f_i$
 c=velocity of light
 fi=i-th fundamental resonance frequency of transmission cable
 εri=dielectric constant of the dielectric portion of the i-th cylindrical member Further, in the low-EMI cable connector according to this invention, a plurality of the cylindrical members described above forming a short-circuiting termination line are arranged coaxially.

Furthermore, the low-EMI cable connector according to the invention is characterized in that the short-circuiting member is configured replaceably.

What is more, in the low-EMI cable connector according to this invention, a plurality of the cylindrical members forming the short-circuiting termination line share a center axis and are arranged along the center axis.

In addition, in the low-EMI cable connector according to this invention, the cylindrical members forming the short-circuiting termination line each can be adjusted in the direction of the center axis.

With this configuration, the impedance of the short-circuiting termination line becomes substantially infinitely large at the resonance frequency thereof, and the current of the resonance frequency flowing in this line is suppressed to almost zero. In view of this, the current causing the unrequired radiation can be effectively suppressed by setting the resonance frequency of this short-circuiting termination line equal to the frequency generating the unrequired radiation by the resonance of the transmission cable.

Assume that the short-circuiting termination line is configured of a bottomed cylindrical portion including a dielectric portion. Let εri be the dielectric constant of the dielectric portion, and λi be the wavelength of the current flowing in the conductor portion. In this short-circuiting termination line, the wavelength λi' is given as λi/√εri. Thus, the length of the bottomed cylindrical portion of the short-circuiting termination line can be rendered as short as 1/√ri times the length of the transmission cable. When a dielectric material having εri of 900 is used, for example, the length of the bottomed cylindrical portion can be as long as 1/30 of the transmission cable involved. For the coaxial cable 75 cm long which resonates at 100 MHz, for example, the length of the bottomed cylindrical portion is only 2.5 cm.

In the case where the transmission cable has a different fundamental resonance frequency as when the external conductor of the coaxial cable is grounded midway or otherwise, an unrequired radiation corresponding to the fundamental frequency occurs. By arranging a plurality of the short-circuiting termination lines coaxially or along the center axis, however, the current for generating the unrequired radiation for each fundamental resonance frequency can be effectively suppressed by each short-circuiting termination line.

In order to achieve the above-mentioned second object, the low-EMI cable connector according to this invention is cylindrical and comprises, on the inner surface thereof, a dielectric portion surrounding the whole periphery of the transmission cable, and a resistor making up a matching termination resistor on the termination side of the cylindrical member.

With this configuration, the presence of the matching termination resistor causes a current to flow in the dielectric portion without reflection, and this current is effectively suppressed by being thermally converted by the matching termination resistor. In this case, the length of the cylindrical member is arbitrary, the above-mentioned matching termination resistor compatible with the cylindrical member is provided.

In order to achieve the above-mentioned second object, the low-EMI cable connector according to this invention comprises n (n: 1, 2, . . . ) cylindrical members with a dielectric portion on the inner surface arranged thereof and surrounding the whole periphery of the transmission cable, wherein the termination side of the cylindrical members is open and forms an open termination line, and the resonance frequency of the open termination line is equal to the resonance frequency of the trans- mission cable.

Also, in the low-EMI cable connector according to this invention, the length of the i-th (i: 1, 2, . . . , n) one of the cylindrical members forming the open termination line is given as $$\frac{l_t}{2} = \frac{1}{4} \times \frac{\lambda_i}{\sqrt{\varepsilon_{ri}}} \qquad \text{(Expression 2)}$$

where
 $\lambda_i = c/f_i$
 c=velocity of light
 fi=i-th fundamental resonance frequency of the transmission cable
 εri=dielectric constant of dielectric portion of the i-th cylindrical member Further, in the low-EMI cable connector according to this invention, a plurality of the cylindrical members forming the open termination line share a center axis and are arranged along the center axis.

Furthermore, the low-EMI cable connector according to this invention is configured in such a manner that the cylindrical members forming the open termination line each is capable of being adjusted in position along the direction of the center line.

This configuration is equivalent to the arrangement in which the short-circuiting termination is provided at the intermediate position of the open termination line, i.e. at the intermediate position of the cylindrical member at the resonance frequency. Under this condition, the impedance becomes almost infinitely large. Consequently, by setting the resonance frequency equal to the resonance frequency causing the unrequired radiation of the transmission cable, the current of the frequency causing the unrequired radiation of the transmission cable can be effectively suppressed.

In this case, however, the length of the open termination line, i.e. the length of the cylindrical member is double the length for the invention having a short-circuiting termination line. Nevertheless, the cylindrical portion is reduced in size.

Also, in the case where the transmission cable has a different fundamental resonance frequency and generates the unrequired radiation corresponding to the fundamental frequency like in the invention having the short-circuiting termination line described above, the current causing the unrequired radiation for each fundamental resonance frequency can be effectively suppressed with each open termination line by arranging a plurality of the open termination lines coaxially or along the center axis.

BEST MODE FOR CARRYING OUT THE INVENTION

Embodiments of the present invention will be explained below with reference to the drawings.

Figure 1:
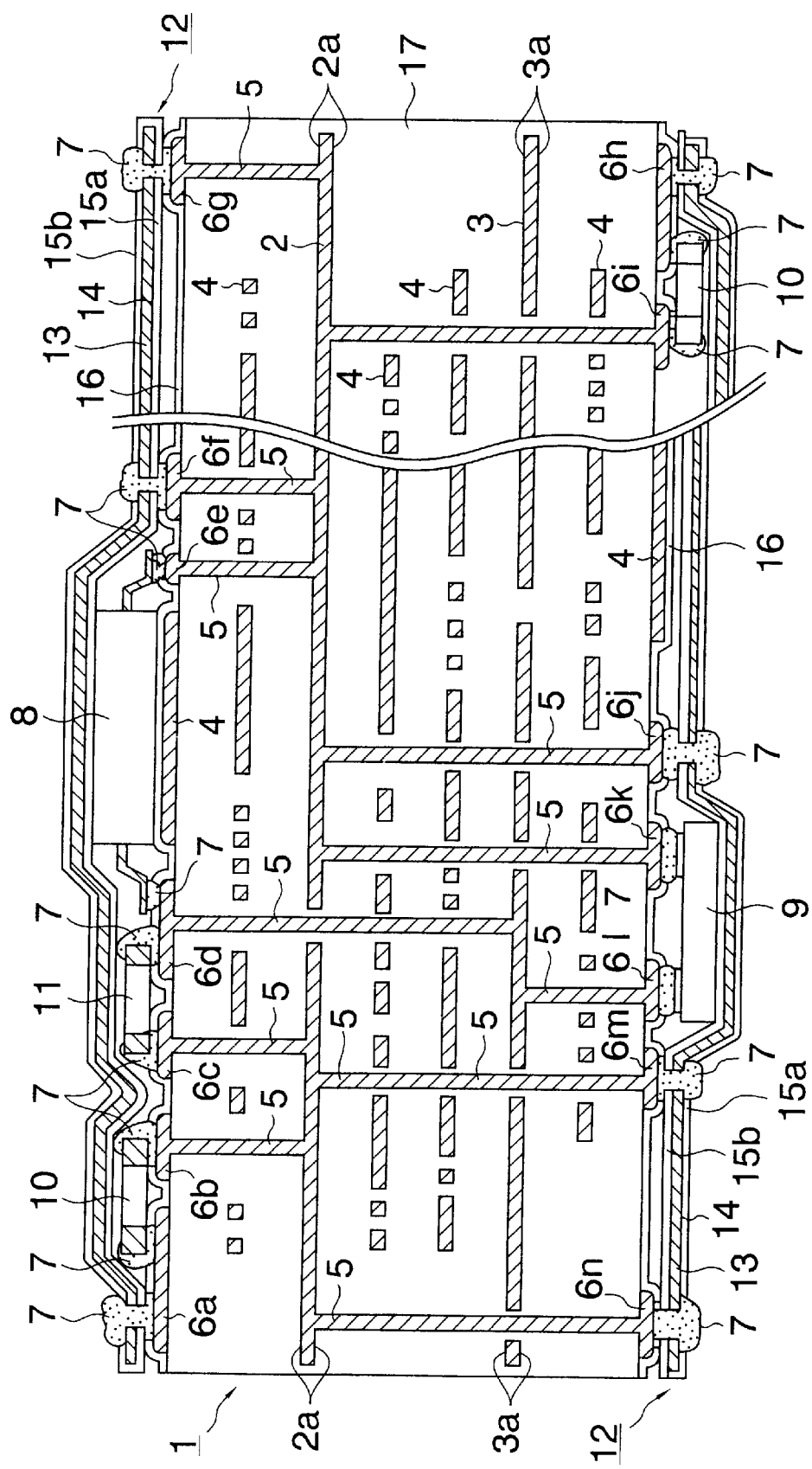
FIG. 1 is a sectional view showing a low-EMI circuit board according to an embodiment of the present invention, FIG. 2(a) and FIG.(b) are a diagram showing the position at which the loss layers are formed in the power layer and the ground layer in FIG. 1.

FIG. 1 is a sectional view showing a low-EMI circuit board according to an embodiment of the present invention. 1 designates a multilayer circuit board, 2 a ground layer, 2a loss layers, 3 a power layer, 3a loss layers, 4 signal line layers, 5 through holes, 6a to 6n electrode patterns, 7 solders, 8 an LSI element, 9 an IC element, 10 matching termination resistor elements, 11 a resistor element, 12 a shield plate, 13 conductive foils, 14 loss layers, 15a, 15b, 16 insulating layers, and 17 a dielectric layer.

In the drawing, this embodiment is configured in such a manner that the shield plate 12 is mounted on the surface of the multilayer circuit board 1 with the ground layer 2, the power layer 3 and the signal line layers 4 arranged thereon. In place of the solders 7 in this case, conductive adhesives are sometimes used for the reason of the heat resistance, especially, when the shield plate 12 is mounted.

This multilayer circuit board 1 has the ground layer 2 and the power layer 3 arranged in the dielectric layer 17, and a single signal line layer 4 is arranged between one surface layer and the ground layer 2, two signal line layers 4 are arranged between the ground layer 2 and the power layer 3, and a single signal line layer 4 is arranged between the power layer 3 and the other surface layer. Further, a signal line layer is arranged on each surface layer, thereby constituting what is called an 8-layer board.

An electrode pattern is arranged at a predetermined portion of the signal line layer 4 formed on each surface layer, and some of them are connected electrically to the ground layer 2, while others are connected electrically to the power layer 3. only the electrode patterns 6a to 6n are shown here, and in the description that follows, only the electrode patterns 6a to 6n will be referred to as the whole electrode patterns. The electrode patterns 6, 6c, 6e to 6g, 6i to 6k, 6m, 6n are connected electrically to the ground layer 2 through the through holes 5. The electrode patterns 6d, 6l, on the other hand, are electrically connected to the power layer 3 through the through holes 5.

It is assumed that a terminal of the resistor element 11 making up the desired circuit is mounted on the electrode pattern 6d connected to the power layer 3 and the electrode pattern 6c connected to the ground layer 2, that the lead of the LSI element 8 molded to the electrode pattern 6d and the electrode pattern 6e connected to the ground layer 2 is mounted by the solders 7, and that the lead of the packaged IC element 9 is mounted by the solders 7 on the electrode pattern 6l connected to the power layer 3 and the electrode pattern 6k connected to the ground layer 2. In the process, the IC element 9 may be mounted in the form of a bare chip.

The shield plate 12 is arranged in such a manner as to cover the two whole surfaces of the multilayer circuit board 1 including the LSI element 8, the IC element 9 and the resistor element 11 mounted thereon. The shield plate 12, which is made of a thin plate having a completely flat surface, may have a multiplicity of small holes for securing the radiation of heat from the IC element, the LSI element, etc. In the process, the hole diameter (shape) ø is assumed to be not more than $\lambda/60$ ($\lambda$ is the radiation wavelength) taking the area of suppressing the unrequired radiation into consideration. The shield plate 12 and the ground layer 2 are used to suppress mainly the radiation of differential mode.

The shield plate 12 is mounted by the solders 7 on the electrode patterns around the multilayer circuit board 1. FIG. 1 shows the electrode patterns 6a, 6g, 6h, 6n as the electrode patterns around the multilayer circuit board 1.

The shield plate 12 is such that the two surfaces of the conductive foil (such as a copper foil) having the loss layer 14 on the surface thereof nearer to the multilayer circuit board 1 are covered with insulating layers 15a, 15b, and due to the loss layer 14, forms a line with a large attenuation constant $\alpha$ with the ground layer 2. The insulating layer 15a covering the surface of the conductive foil 13 on the loss layer 14 side is made of a heat-resistant insulating film such as of polyimide or polyester. The insulating layer 15b on the opposite side is formed of a resist material or the like printed, coated or sprayed in order to prevent the oxidation or assure the electrical insulation of the conductive film 13. Of course, the insulating layer 15b is not essential, but in the absence thereof, the surface of the conductive layer 13 is subjected to an anti-oxidation treatment. Also, the insulating film described above may be used.

The shield plate 12 is electrically connected to the electrode patterns 6a, 6g, 6h, 6n with the conductive foil 13 connected with the solders 7.

The loss layers 14 may be nickel plated layers or chromium plated layers, for example, having a large resistivity. As an alternative, the surface of the conductive foil 13 can be roughened so that the trans-mission path is lengthened to increase the resistance value equivalently. In such a case, the adhesion is improved between the conductive layer 13 and the insulating film such as of polyimide constituting the insulating layer 15a.

Also, the shield plate 12 is desirably flexible and formed with a die in accordance with the roughness of the component parts mounted on the multilayer circuit board 1. If formed with a die in this way, the mounting on the multilayer circuit board 1 is easy. Also, the portions mounted on the electrode patterns 6a, 6g, 6h, 6n are reasonably arranged proximate to the electrode patterns 6a, 6g, 6h, 6n, respectively, thereby simplifying the soldering work.

According to this embodiment, the radiation of differential mode generated from the LSI element 8 or the IC e element 9 is contained between the shield pate 12 and the ground layer 2. The mere provision of the shield plate 12 independent of the ground layer 2, however, would generate the radiation of differential mode by the high harmonics of the fast clock from the fast operating parts or the signal processed based on the fast clock, whereby energy is accumulated between the shield plate 12 and the ground layer 2, and the resulting potential difference between the shield plate 12 and the ground layer 2 causes a resonance. Thus, the reflection occurring in the peripheral portion thereof generates a standing wave, and an electric field is generated in the peripheral portion of the shield plate 2 and the ground layer 2 thereby to generate the unrequired radiation. In other words, the shield plate 12 suppresses the radiation of differential mode, with the result that a new radiation of common mode would be caused.

In order to prevent this phenomenon, according to this embodiment, the shield layer 12 and the ground layer make up substantially parallel lines. These lines are electrically connected at a termination, thereby making it difficult for the standing wave to occur in the shield plate 12. In this way, the unrequired radiation is suppressed from the peripheral portion of the shield plate 12. Methods of connection include (1) connecting through a resistor element having a resistance value near to the matching termination resistance value, and (2) attaching the function as a shield by direct connection. FIG. 1 shows the case in which the shield plate 12 is connected to the ground layer 2 by these two methods. In spite of this, one of the two methods can be employed.

First, the method (1) will be described.

The electrode patterns 6a, 6h arranged on the periphery of the surface layer of the multilayer circuit board 1 are connected with the shield plate 12 by the solders 7. A terminal of a chip resistor 10 of a predetermined resistance value is mounted by the solders 7 on the electrode pattern 6a and the electrode pattern 6b around the multilayer circuit board 1 which is connected to ground layer 2 via the through hole 5, in such a manner as to produce a termination resistance value proximate to the matching termination resistance value. Also, a terminal of the chip resistor 10 of a predetermined resistance value is mounted by the solders 7 on the electrode pattern 6h and the electrode pattern 6i around the multilayer circuit board 1 connected to the ground layer 2 via the through hole 5. Specifically, the peripheral portion of the shield plate 12 is connected to the ground layer 2 through the chip resistor 10. Actually in this case, however, in view of the requirement of the termination in the fashion of a distributed constant, a plurality of chip resistors 10 are connected in parallel for substantially equidistant termination at a pitch determined by the structure of the multilayer circuit board 1 (25 to 50 mm, for example, in the case of an 8-layer board of about A4 size) in the peripheral portion of the multilayer circuit board 1. In such a case, the inductance component depending on the structure of the through holes 5 and the electrode patterns 6a, 6b, 6h, 6i is set to a sufficiently small level as compared with the termination resistance value.

As a result, the unrequired radiation of common mode is suppressed which is newly generated from the peripheral portion of the shield plate 12 which has shielded the radiation of differential mode.

Next, the method (2) will be explained.

The peripheral portion of the shield plate 12 is connected by the solders 7 to the electrode patterns 6g, 6n, etc. electrically connected to the ground layer 2 via the through hole 5. Specifically, the shield plate 12 and the ground layer 2 are directly connected electrically only via the through hole 5, so that the shield plate 12 assumes the same potential as the ground layer 2.

With this configuration, the radiation of differential mode is generated from the LSI element 8 and the IC element 9 adapted for fast operation and the signal line layers (high-speed signal line layers) 4 for transmitting the high frequency signal and the clock (such component parts mounted and the high-speed signal line layers 4 are hereinafter called the fast operating parts). However, the fast operating parts providing a radiation source are shielded in such a manner as to be enclosed by the ground layer 2 and the shield plate 12 via the through holes 5. Thus the radiation is contained between the ground layer 2 and the shield plate 12, and at the same time, the shield layer 12 and the ground layer 2 are set to the same potential by being electrically connected to each other via the through holes 5. Therefore, a standing wave, even if generated in the shield plate 12 and the ground layer 2, fails to emerge so that the unrequired radiation can be effectively suppressed also from the peripheral portion of the shield plate 12.

As described above, the short-circuiting the ground layer 2 and the shield plate 12 via the through holes 5 also transfers the resonance frequency of the loop involved to a frequency region higher than the region for suppressing the unrequired radiation. As a result, the resonance in this frequency region is suppressed thereby to reduce the unrequired radiation in this frequency region. This frequency transfer can be not less than 1 GHz, whereby the frequency of the unrequired radiation can be transferred to a frequency band free of regulation.

Also, the generation of the radiation of differential mode described above leads to the generation of a high frequency current due to the standing wave in the loop configured of the ground layer 2, the through holes 5 and the shield plate 12. This high frequency current, however, flows along the inner surface of the conductive foils 13 (along the surface on the multilayer circuit board 1 side) of the shield plate 12 in opposed relation to the ground layer 2. The provision of the loss layer 14 on the particular surface attenuates by converting the high frequency current into Joule heat. As a result, the generation of the standing wave is suppressed, whereby the unrequired radiation generated from the peripheral portion of the shield plate 12 is also reduced.

In the above-mentioned manner, the shield plate 12 and the ground layer 2 are connected to each other directly or through a matching termination resistor. Thus, the radiation of differential mode can be effectively suppressed while at the same time suppressing the new generation of the radiation of common mode.

The LSI element and the drive IC element generates an especially great amount of the radiation of differential mode. These circuit elements, therefore, are shielded with double connection areas using the shield plate 12. Specifically, assume that the LSI element 8 and the IC element 9 are involved. The electrode patterns such as the electrode patterns 6f, 6j, 6m electrically connected to the ground layer 2 at a pitch corresponding to the operating frequency are arranged around the LSI element 2 and the IC element 9, and are electrically connected to the shield plate 12 by soldering. In other words, the peripheral portions of the LSI element 8 and the IC element 9 on the shield plate 12 are connected at multiple points with the ground layer 2 and shielded partially by the shield plate 12. As a result, the unrequired radiation of differential mode is contained by the current loop including the shielded portion of the shield plate 12 and the ground layer 2, and suppressed by the loss layers 14.

In this way, the radiation of differential mode generated by the LSI element 8 and the IC element 9 is shielded at the periphery thereof by the shield plate 12 and the ground layer 2. At the same time, the radiation of differential mode is also shielded by the periphery of the multilayer circuit board 1 for double shielding. The radiation is absorbed by each of the shields. Further, the strong radiation of common mode generated from these parts is effectively suppressed.

Though not shown, the signal line layers 4 inserted are also connected to the power layer 3 and the ground layer 2 directly or through the mounted component parts. Especially upon activation of a fast operating part, a high frequency current flows in the ground layer 2 and the power layer 3. This high frequency current flows also in the peripheral portion of the ground layer 2 and the power layer 3, and the resonance between them causes the radiation of common mode.

In order to prevent this, according to this embodiment, loss layers 2a, 3a are arranged along the peripheral portion of the multilayer circuit board 1 in the ground layer 2 and the power layer 3 thereby to attenuate the high frequency current due to the resonance. The loss layers 2a, 3a are arranged in the range outside of the junction point between the ground layer 2 or the power layer 3 and the signal line layers via the through hole 5 not to interfere with the operation of the parts and the circuits mounted on the multilayer circuit board 1. The loss layers 2a, 3a can also be similar to the loss layer 14 of the shield layer 12.

Figure 2:
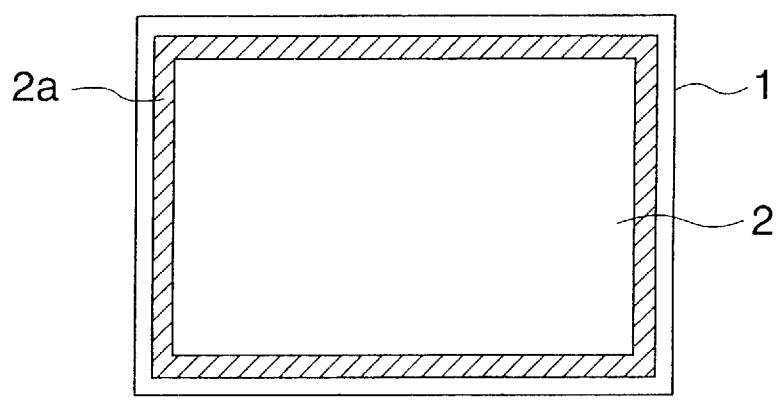
Figure 2:
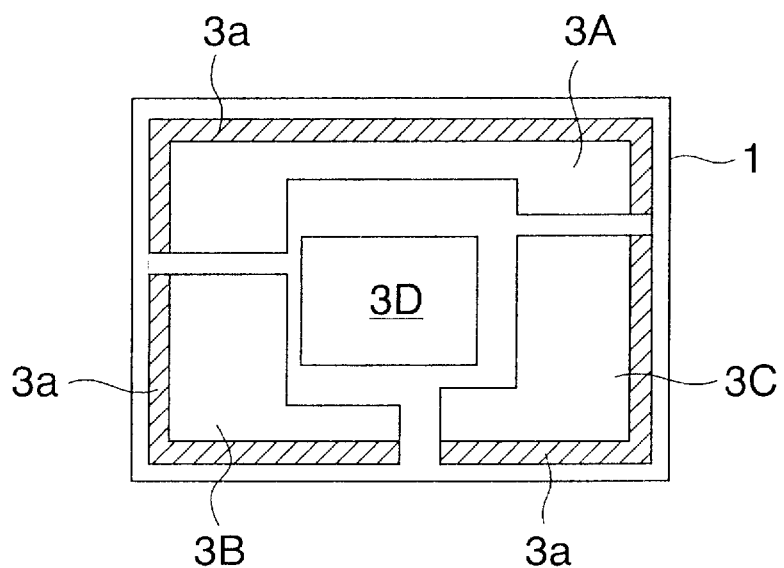

FIG. 2(*a*) shows the loss layer 2a of the ground layer 2. The ground layer 2 is arranged substantially over the entire section of the multilayer circuit board 1, and therefore the loss layer 2a is arranged over the entire peripheral portion thereof. FIG. 2(*b*) shows the loss layer 3a of the power layer 3. In this case, four different power layers 3A, 3B, 3C, 3D with different source voltages are assumed to exist. The loss layer 3a is arranged in the portion of the power layer 3 corresponding to the peripheral portion of the multilayer circuit board 1. In the case of FIG. 2(*b*), therefore, the loss layer 3a is arranged in a part of the peripheral portion of the power layers 3A, 3B, 3C, but not in the power layer 3D arranged at the central part of the multilayer circuit board 1.

As described above, according to this embodiment, the radiation of differential mode generated from the mounted component parts and the signal line layer can be very effectively suppressed.

In this embodiment, the shield plate 12 is fixed on the multilayer circuit board 1 by the solders 7. By removing the solders 7, therefore, the shield plate 12 can be easily removed and the mounted parts can be easily replaced. Consequently, any one of the mounted parts, if it runs out of order, can be easily replaced to reuse the circuit board. From the viewpoint of heat resistance and environmental protection, a conductive adhesive (a thermo-setting resin containing Ag (Cu, Au) powder, for example) is sometimes used instead of the solders 7.

The shield plate 12 is arranged on the two sides of the multilayer circuit board 1 in this embodiment. In the case where a fast operating part is mounted or the signal line layers are arranged only on one side, however, it is obviously sufficient to arrange the shield plate 12 only on the particular side.

Further, in the multilayer circuit board 1, the more the high-speed signal lines providing a radiation source are arranged in the peripheral portion of the multilayer circuit board 1, the more radiation of differential mode is generated from the particular peripheral portion. The high-speed signal lines, therefore, are preferably arranged on the central portion in the multi-layer circuit board 1.

Figure 3:
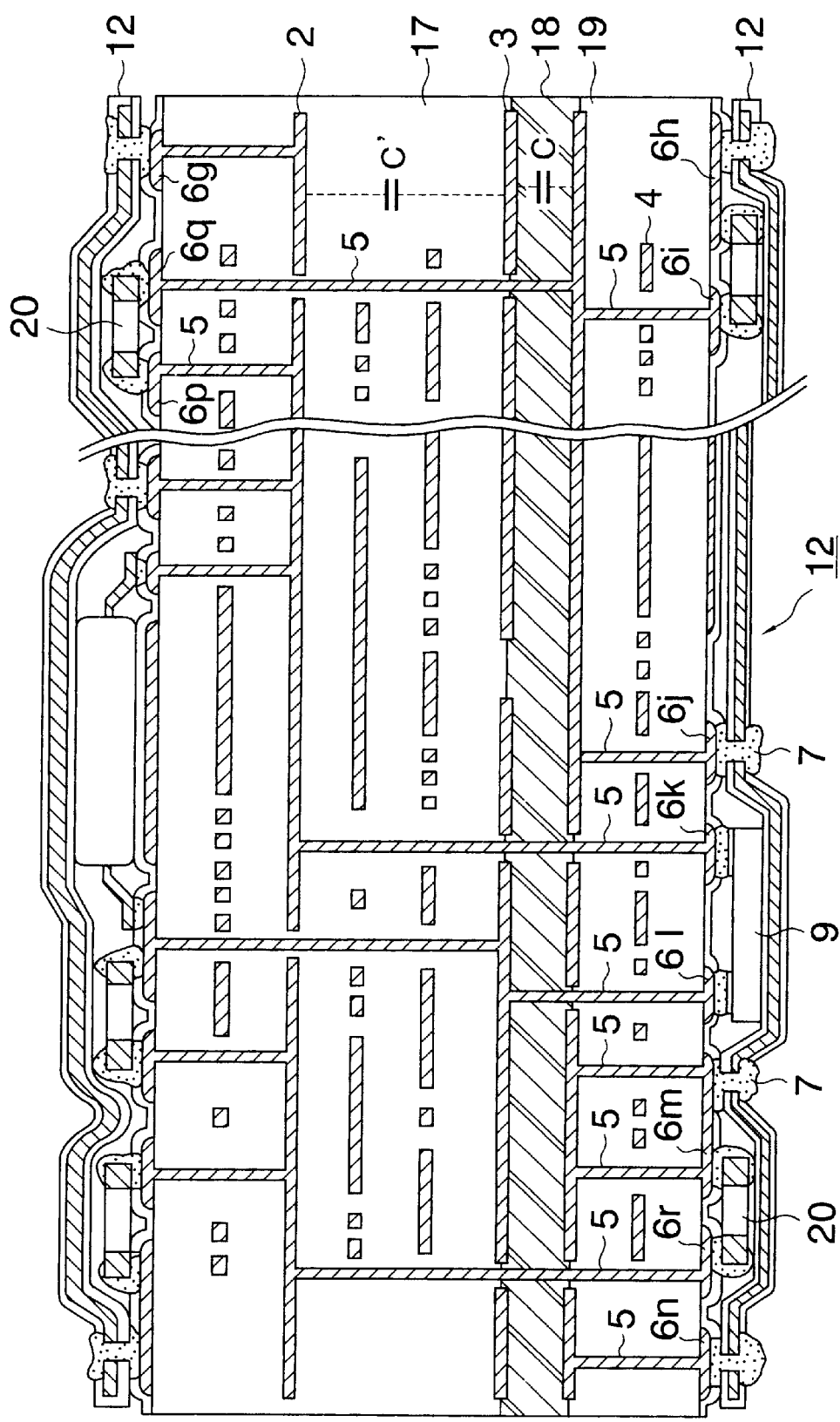
FIG. 3 is a sectional view showing a low-EMI circuit board according to an embodiment of the present invention.

FIG. 3 is a sectional view showing a low-EMI circuit board according to another embodiment of the present invention. 6p, 6q, 6r designate electrode patterns, 18 a dielectric layer, 19 a ground layer and 20 a resistor element. The same parts as the corresponding parts in FIG. 1 are designated by the same reference numerals, respectively, and will not be explained again. The reference numerals are also partly omitted.

In this embodiment, not only the radiation of differential mode is suppressed, but also the radiation of common mode can also be suppressed anew.

In FIG. 3, another ground layer 19 is arranged between the power layer 3 and the signal line layer 4 on the side of the power layer 3 far from the ground layer 2, and a dielectric layer 18 having a dielectric constant $\epsilon r$ different from the dielectric layer 17 is arranged between the ground layer 19 and the power layer 3. This dielectric layer 18 forms a capacitor C with the power layer 3 and the ground layer 19 as electrodes, and is configured to exhibit a sufficiently small impedance against the high harmonics such as a fast clock.

A resistor element 20 is connected between the electrode patterns 6p and 6q on one of the surface layers on the peripheral portion side of the multilayer circuit board 1, and another resistor 20 is connected between the electrode patterns 6m and 6r on the other surface layer. The electrode patterns 6p, 6r are connected to one ground layer 2 via the through holes 5, while the electrode patterns 6q, 6m are connected to the other ground layer 19 via the through holes 5.

Therefore, the power layer 3 and the ground layer 19 are connected to each other through the capacitor C including the dielectric layer 18, and the ground layer 19 is connected to the ground layer 2 through the resistor element 20.

With this configuration, even when the potential of the power layer 3 tends to fluctuate due to the high harmonics such as the fast clock, the harmonics current is supplied to the resistor element 20 through the capacitor C including the dielectric layer 18 and further flows to the ground layer 2. In the process, the harmonics current is attenuated by being converted into Joule heat in the resistor element 20. As a result, the potential fluctuation due to the high harmonics generated between the ground layer 2 and the power layer 3, especially, the resonance current is suppressed, thereby suppressing the radiation of common mode.

A capacitor C' constituting an interlayer stray capacity due to the dielectric layer 17 is interposed between the power layer 3 and the ground layer 2. This capacitor C' has so high a Q that the mounted parts such as the LSI element, IC element and the chip capacitor come to hold an impedance component of inductive characteristic in high harmonics region. The parallel resonance of these components generates the radiation of common mode.

According to this embodiment, however, the series circuit including the capacitor C due to the dielectric layer 18 and the resistor element 20 is connected in parallel to the capacitor C'. Therefore, when the impedance of the capacitor C is set sufficiently small as compared with the resistance value of the resistor element 20, the capacitor C is ignored and the resistor element 20 is connected in parallel to the capacitor C'. The inductance component due to the electrode patterns 6p, 6r and the through holes 5 generated at the time of packaging is set in such a manner that the impedance can be sufficiently ignored as compared with the resistor element 20. By setting the resistance value of the resistor element 20 to an appropriately small value, the Q of the capacitor C' can be reduced. As a result, the energy consumption in the resistor 20 increases, so that the potential fluctuation in the power layer 3 is effectively absorbed by the resistor element 20 thereby to reduce the radiation of common mode.

The capacitor C is for cutting DC, i.e. for cutting the DC voltage from the power layer 3 to the ground layer 19.

Also, according to this embodiment, the shield plates at upper and lower sides of the drawing are connected to the ground layer 2 and the ground layer 19 by the through holes 5 and the electrode patterns 6n, 6q, etc. of the peripheral portion of the multilayer circuit board 1. As a result, each of the two surfaces of the board 1 has a structure to be shielded by the shield 12, the ground layer 2, the ground layer 19 and the through holes 5 at multiple points. Thus, the radiation of differential mode due to the mounted component parts and the signal line layer 4 arranged in the shield structure is suppressed.

FIG. 4(a) is a longitudinal sectional view showing a low-EMI cable connector according to a first embodiment of the invention, and FIG. 4(b) is a cross sectional view taken in line X—X in FIG. 4(a). 21 designates a cylindrical portion of the base, 21a a female screw portion, 21b a soldered portion, 22 a bottomed cylindrical portion, 22a a short-circuiting termination portion, 22b a dielectric portion, 23 a bottomed cylindrical portion, 23a a short-circuiting termination portion and 23b a dielectric portion.

In this drawing, the bottomed cylindrical portion 22 of a conductor having a length $l_1$ is arranged on the outer peripheral surface of the base cylindrical portion 21 made of a conductor, and the bottomed cylindrical portion 23 made of a conductor having a length $l_2$ is arranged on the outer peripheral surface of the bottomed cylindrical portion 22. These two bottomed cylindrical portions 22, 23 are laid one on the other concentrically. The bottomed cylindrical portion 22 has the depth thereof closed by the short-circuiting termination portion 22a, thereby forming a line terminated by short-circuiting. Similarly, the bottomed cylindrical portion 23 has the depth thereof closed by the short-circuiting portion 23a thereby to form a line terminated by short-circuiting. Also, a dielectric material of a dielectric constant $\epsilon r1$ is filled to form a dielectric portion 22b in the bottomed cylindrical portion 22. In similar fashion, a dielectric material of a dielectric constant $\epsilon r2$ is filled to form a dielectric portion 23b in the bottomed cylindrical portion 23.

A coaxial cable is fitted on the inner diameter of the base cylindrical portion 21, and for this purpose, a female screw portion 21a is formed to be screwed with a male screw portion formed on the outer peripheral surface of the coaxial cable not shown. Also, a solder portion 21b is formed with the Au plating or the like applied at the end of the outer peripheral surface of the base cylindrical portion 21 far from the portion of the same outer peripheral surface where the bottomed cylindrical portion 22 is arranged.

The short-circuiting termination line of length $l_1$ including the bottomed cylindrical portion 22 resonates at $\lambda 01/(2n-1)$, where n is 1, 2, 3, ..., for the wave-length $\lambda 01$ satisfying the relation $l_1=\lambda 01/4$, and the impedance Z01 as viewed from the open side (shown by arrow) of the bottomed cylindrical portion 22 becomes substantially infinitely large at the resonance point. In similar fashion, the short-circuiting termination line of length $l_2$ including the bottomed cylindrical portion 23 resonates at $\lambda 02/(2n-1)$ for the wavelength $\lambda 02$ satisfying the relation $l_2=\lambda 02/4$, and the impedance Z02 as viewed from the open side (shown by arrow) of the bottomed cylindrical portion 23 becomes almost infinitely large at the resonance point.

Assume that the angular frequency (resonance angular frequency) for the wavelength $\lambda 01$ is $\omega 0$ (=$2\pi f0$).

Figure 5:
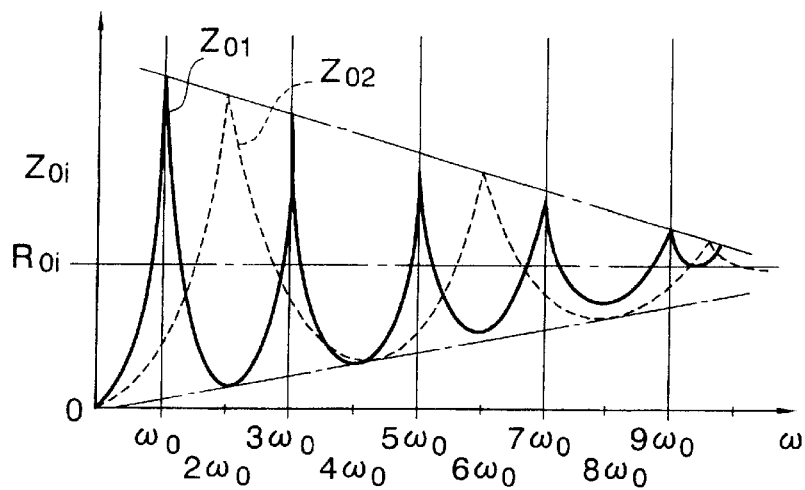
FIG. 5 is an impedance characteristic diagram of the low-EMI cable connector shown in FIG. 4.

The impedance Z01 of the short-circuiting termination line including the bottomed cylindrical portion 22 changes as shown by solid line in FIG. 5 according to the angular frequency $\omega$, and becomes almost infinitely large by resonating at the angular frequencies $\omega 0$, $3\omega 0$, $5\omega 0$, $7\omega 0$, $9\omega 0$, ... Also, assuming that $\lambda 02=\lambda 01/2$, the resonance angular frequency is double the above-mentioned resonance frequency, the impedance Z02 of the short-circuiting termination line including the bottomed cylindrical portion changes as shown by dashed line in FIG. 5 according to the angular frequency $\omega$, and becomes almost infinitely large by resonating at the angular frequencies $2\omega 0$, $6\omega 0$, $10\omega 0$, .... These impedance Z01, Z02 converge to the matching termination resistance values R01, R02, respectively, of the respective lines.

Next, explanation will be given of the case in which this low-EMI cable connector is used for the transmission line with the coaxial cable shown in FIG. 13.

Figure 6:
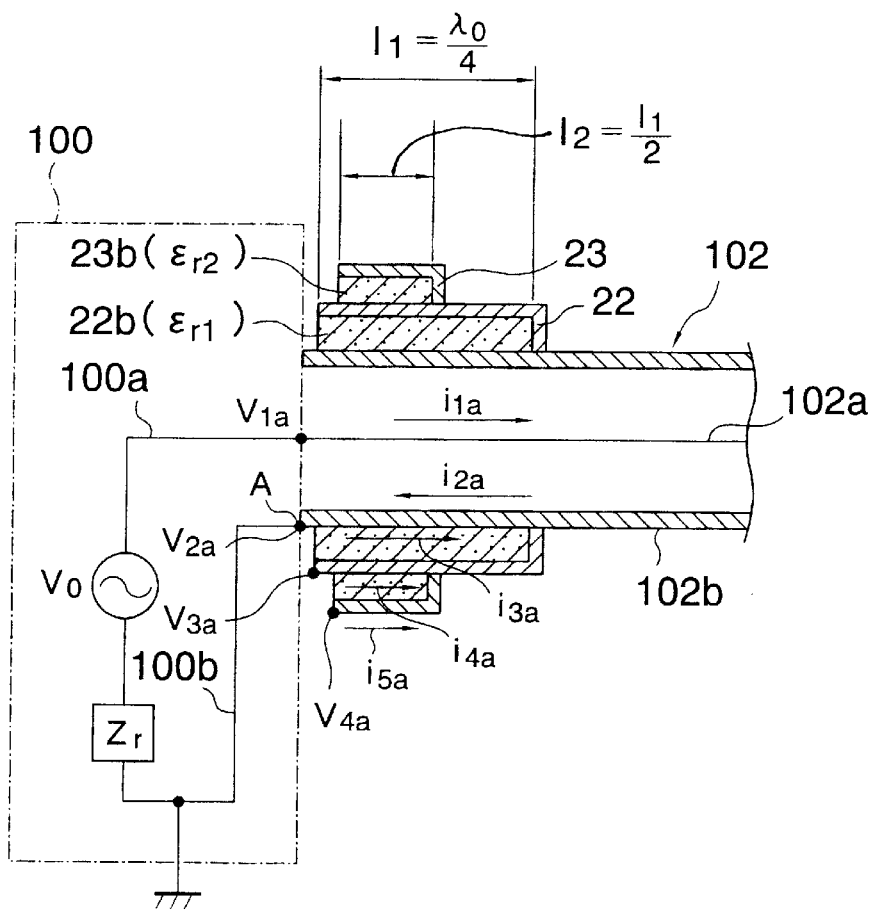
FIG. 6 is a sectional view showing the mounting and the operation on the transmitting unit side of the low-EMI cable connector shown in FIG. 4.
Figure 13:
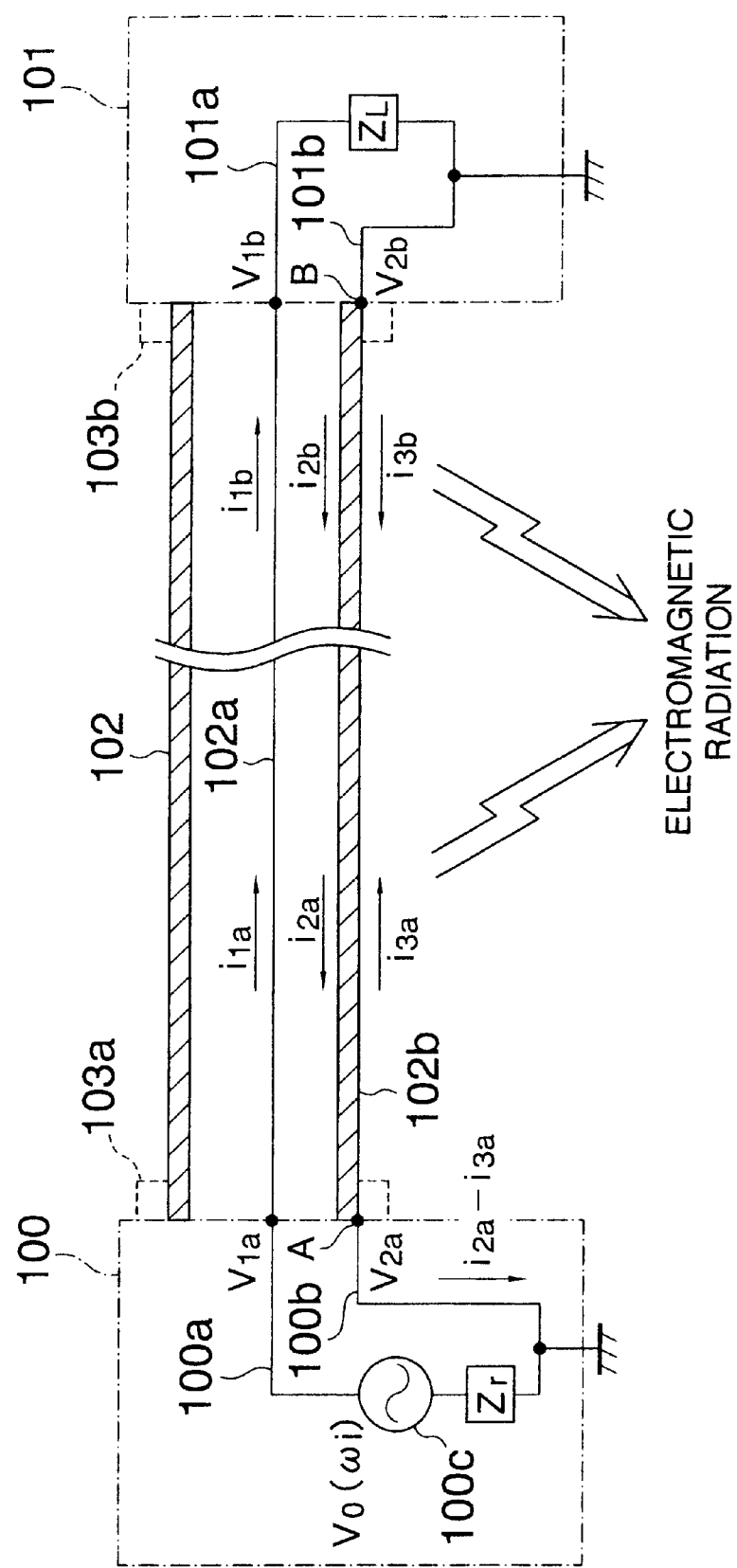
FIG. 13 is a diagram for explaining the generation of the unrequited radiation from the transmission cable.

FIG. 6 is a view showing the state in which the low-EMI cable connector is arranged at the end of the coaxial cable 102 nearer to the transmitting terminal unit 100 in FIG. 13. The same component parts as the corresponding ones in the preceding drawing are designated by the same reference numerals, respectively.

In this drawing, the low-EMI cable connector is mounted at the end of the coaxial cable 102 in such a position that the open side of the bottomed cylindrical portions 22, 23 is directed toward the transmitting terminal unit 100. For this mounting, as explained with reference to FIG. 4, the male screw portion (not shown) arranged at the end of the coaxial cable 102 is screwed into the female screw portion 21a arranged in the base cylindrical portion 21 of the low-EMI cable connector. Also, the solder portion 21b of the base cylindrical portion 21 is soldered to the case or the like of the transmitting terminal unit 100. In FIG. 6, however, the base cylindrical portion 21 is not shown.

As explained with reference to FIG. 13, the current i2a that has flowed toward the transmitting terminal unit 100 along the inner surface of the external conductor 102b of the coaxial cable 102 partly leaks out at the junction point A between the external conductor 102b of the coaxial cable 102 and the inward line 100b of the transmitting terminal unit and tends to flow along the outer surface of the external conductor 102b.

Let i3a be the leakage current of a wavelength $\lambda 0$ (=c/f0) corresponding to the fundamental frequency (clock frequency) f0 of the transmission signal, times 1/(2n-1) (n: 1, 2, 3, ...), i4a be the leakage current of a wave-length $\lambda 0$ times 1/{2×(2n-1)}, and i5a be the leakage current of other wavelengths. Also, assume that the coaxial cable 102 resonates at the fundamental frequency f0 (hence, also at frequencies (2n-1)·f0 equal to odd multiples thereof).

These currents i3a, i4a, i5a flow into the short-circuiting termination line including the bottomed cylindrical portion 22 from the junction point A.

In the short-circuiting termination line including the bottomed cylindrical portion 22 of length $l_1$, as described above, a frequency (2n-1) times the frequency f01 (=c/$\lambda 01$, where c is the velocity of light) for the wavelength λ01 satisfying the relation $l_1=\lambda01/4$ is a resonance frequency at which the impedance Z01 becomes substantially infinitely large. When a current of wavelength λ flows in the dielectric material of dielectric constant εr, on the other hand, the wavelength of the current in this dielectric material is shortened to $\lambda/\sqrt{\varepsilon r}$.

In view of this, consider the current i3a among the currents i3a, i4a, i5a flowing into the short-circuiting termination line including the bottomed cylindrical portion 22. The following relation is obtained for the wavelength λ3a of this current i3a in the short-circuiting termination line.

$$\lambda0' = \frac{\lambda0}{\sqrt{\varepsilon_{rl}}} \quad \text{(Expression 3)}$$

The length $l_1$ of the short-circuiting termination line including the bottomed cylindrical portion 22 is set in such a manner that the resonance occurs at this wavelength λ0', i.e. in such a manner that λ0'=λ01. In this way, the impedance Z01 of the short-circuiting termination line including the bottomed cylindrical portion 22 becomes substantially infinitely large for the current i3a of the wavelength λ0/(2n−1). This current i3a can thus be suppressed almost completely.

Under this condition, the length $l_1$ of the short-circuiting termination line including the bottomed cylindrical portion 22 is given as $$l_t = \frac{\lambda0'}{4} = \frac{\lambda0}{4 \cdot \sqrt{\varepsilon_{rl}}} \quad \text{(Expression 4)}$$

In this way, the leakage current i3a can be reduced substantially to zero in the short-circuiting termination line including the bottomed cylindrical portion 22. The other leakage currents i4a, i5a, however, though attenuated to some degree, pass through the short-circuiting termination line including the bottomed cylindrical portion 22 with the same wavelength, for lack of resonance in the short-circuiting termination line including the bottomed cylindrical portion 22, and flow into the short-circuiting termination line including the bottomed cylindrical portion 23.

The leakage current i4a is suppressed in the short-circuiting termination line including the bottomed cylindrical portion 23. For this purpose, the length l2 of the short-circuiting termination line including the bottomed cylindrical portion 23 is set in such a manner that the short-circuiting termination line including the bottomed cylindrical portion 23 resonates at the frequency of the leakage current i4a.

The wavelength λ1 of this current i4a is given as λ1=λ0/2 as described above. Assuming that the dielectric constant εr2 of the dielectric material of the dielectric portion 23b (FIG. 4) in the bottomed cylindrical portion 23 is equal to the dielectric constant εr1 of the dielectric material of the dielectric portion 22b (FIG. 4) in the bottomed cylindrical portion 22, i.e. εr2=εr1, then, from Expression 4 above, $$l_2=l_1/2$$

This shows that the impedance Z02 of the short-circuiting termination line including the bottomed cylindrical portion 23 exhibits a characteristic indicated by dashed line in FIG. 5, and the leakage current i4a of angular frequencies 2ω0, 6ω0, 10ω0, . . . can be suppressed substantially to zero.

As described above, the coaxial cable 102 envelops a resonance at the fundamental frequency f0 and a frequency an odd multiple thereof, and the frequencies even multiples of the fundamental frequency f0 pose no problem. In this case, therefore, the bottomed cylindrical portion 23 is not necessarily required. Nevertheless, the reason why the bottomed cylindrical portion 23 is provided is described later.

Figure 7:
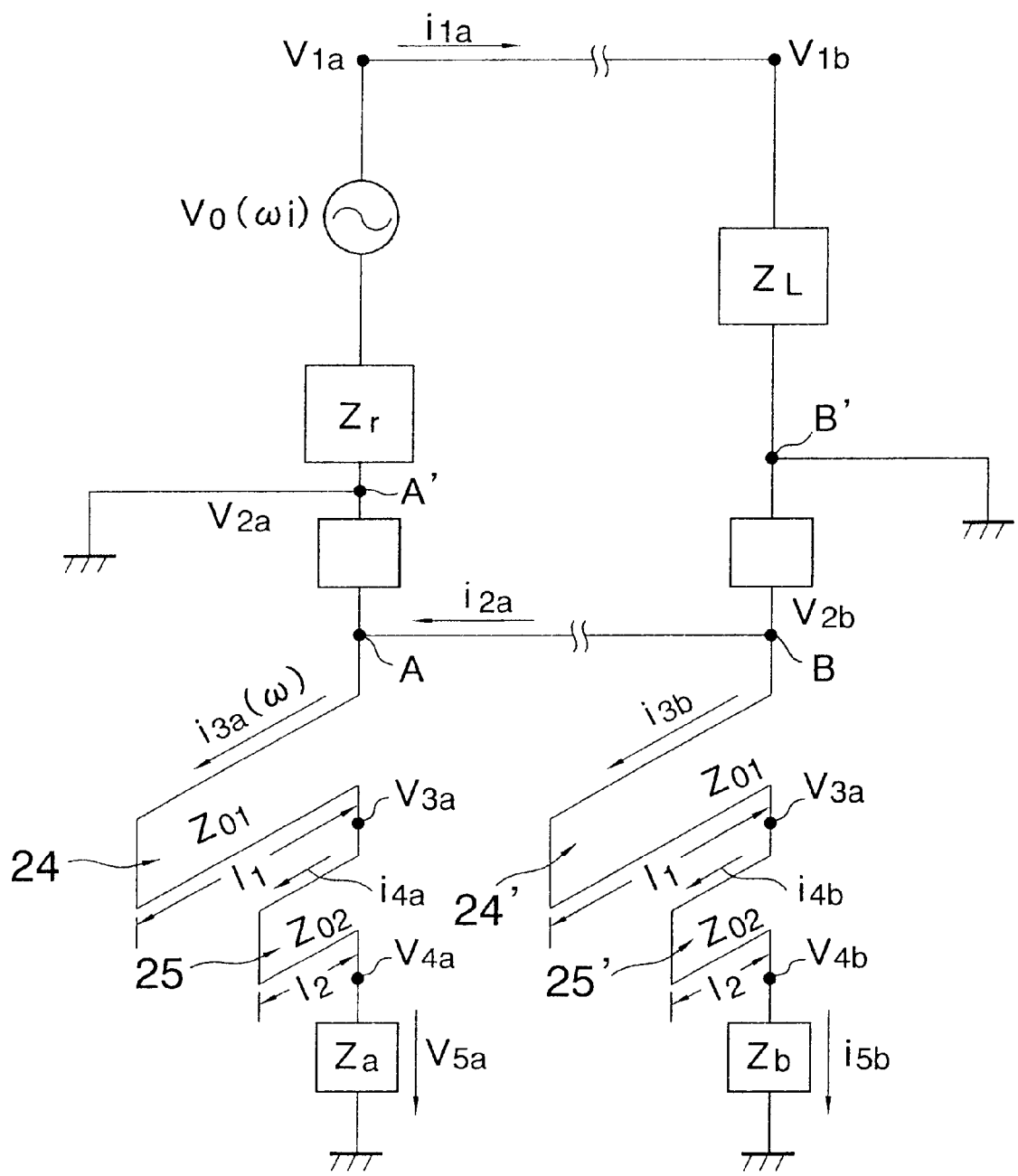
FIG. 7 is a circuit diagram showing an equivalent circuit mounted as shown in FIG. 6.

FIG. 7 shows an equivalent circuit of the configuration described above. 24 designates a short-circuiting termination line including the bottomed cylindrical portion 22 of the low-EMI cable connector on the transmitting terminal unit 100 side, 24' a short-circuiting termination line including the bottomed cylindrical portion 22 of the low-EMI cable connector on the receiving terminal unit 101 side, 25 a short-circuiting termination line including the bottomed cylindrical portion 23 of the low-EMI cable connector on the transmitting terminal unit 100 side, and 25' ma short-circuiting termination line including the bottomed cylindrical portion 23 of the low-EMI cable connector on the receiving terminal unit 101 side. Za, Zb designate the impedance of the external conductor 102b, etc. of the coaxial cable 102.

In this way, on the transmitting terminal unit 100 side, the short-circuiting termination lines 24, 25 including the bottomed cylindrical portions 22, 23 can suppress substantially to zero the currents of the frequencies f0, 2f0, 3f0, 5f0, 6f0, 7f0, 9f0, 10f0, . . . reflected at the junction point A by the equivalent impedance generated between the junction point A and the grounding point A' for the clock frequency f0 (=ω0/2π) of the transmitted signal. The leakage current i5a having other frequencies can be applied directly along the outer surface of the external conductor 102b of the coaxial cable 102 from the short-circuiting termination lines including the bottomed cylindrical sections 22, 23 without any problem, as long as the amplitude thereof is sufficiently small or the coaxial cable 102 has no frequency causing the resonance. In the case where the coaxial cable 102 oscillates and generates the unrequired radiation, however, a short-circuiting termination line including a bottomed cylindrical portion for suppressing the current i5a is arranged further outside of the bottomed cylindrical portion 23.

This is also the case with the receiving terminal unit 101 side, where the current of the above-mentioned frequencies reflected at the junction point B by the impedance generated between the junction point B and the grounding point B' is sufficiently suppressed by the short-circuiting termination lines 24', 25' including the bottomed cylindrical sections 22, 23 of the low-EMI cable connector.

As clear from Expression 4 above, a dielectric material having large dielectric constants εr1, εr2 is used for the dielectric portions 22b, 23b of the bottomed cylindrical portions 22, 23, thereby making it possible to shorten the lengths $l_1, l_2$ of the bottomed cylindrical portions 22, 23. The dielectric material of strontium titanate or barium titanate has a dielectric constant of 300 to 1000.

In view of this, assume that a dielectric material having a dielectric constant εr1 of 900 is used for the dielectric portion 22b of the bottomed cylindrical portion 22 and that the clock frequency f0 is 200 MHz, $$\lambda0=c/f0=3\times108/(200\times106)=150 \text{ cm}$$

Therefore, from Expression 4, $$l_1=150/(4\times\sqrt{900})=1.25 \text{ cm}$$

Also, if the same dielectric material is used for the dielectric portion 23b of the bottomed cylindrical portion 23, the length $l_2$ of the bottomed cylindrical portion 23 is $l_2=l_1/2=$ 0.625 cm.

As described above, an impedance extremely high as compared with 100 Ω for the conventional ferrite core can be obtained by a cable connector made of a short-circuiting termination line as short as less than 2 cm for the very high clock frequency of 200 MHz. Thus, the unrequired radiation from the coaxial cable 102 can be suppressed almost completely.

Also, the thickness of the bottomed cylindrical portions 22, 23 is such that the short-circuiting termination lines including them have an infinitely large impedance at a predetermined frequency and requires no matching termination resistor of a specific value. The bottom cylindrical sections 22, 23, therefore, can be thinned arbitrarily. For this reason, in this embodiment, which is compact, light in weight and not bulky, the occurrence of the unrequired radiation from the coaxial cable 102 can be suppressed with a sufficiently high effect.

In FIG. 4(a), the bottomed cylindrical portions 22, 23 can be integrally formed on the base cylindrical portion 21. Instead, the bottomed cylindrical portions 22, 23 can be formed as separate cylindrical portions having dielectric portions 22b, 223b, respectively, with a female screw on the inner surface of the bottomed cylindrical portions 22, 23 and a male screw on the outer peripheral surface of the base cylindrical portion 21 and the bottomed cylindrical portion 22. By screwing these screws, the bottomed cylindrical portion 22 can be mounted on the base cylindrical portion 21, and further, the bottomed cylindrical portion 23 can be mounted on the bottomed cylindrical portion 22. In such a case, the position of the bottomed cylindrical portion 22 relative to the base cylindrical portion 21 and the position of the bottomed cylindrical portion 23 relative to the bottomed cylindrical portion 22 can be appropriately adjusted.

Once the low-EMI cable connector is rendered mountable on the coaxial cable 102 by the screws in this way, low-EMI cable connectors for suppressing different frequencies can be provided, so that the desired low-EMI cable connector can be selectively used in accordance with the length of the coaxial cable (hence, the resonance frequency).

In the foregoing description, the coaxial cable 102 is mounted by being screwed to the base cylindrical portion 21 by the female screw 21a or the like (whereby the cable becomes replaceable). As an alternative, however, the base cylindrical portion 21 can of course be integrally fixed with the coaxial cable 102.

Further, the dielectric portions 22b, 23b of the bottomed cylindrical portions 22, 23 can of course be made using dielectric materials of different constants instead of dielectric materials of the same dielectric constant. In such a case, the length of the bottomed cylindrical portions 22, 23 can be rendered substantially equal to each other by use of a dielectric material of a small dielectric constant for the dielectric portion 23b of the bottomed cylindrical portion 23 as compared with the dielectric constant of the dielectric material of the dielectric portion 22b of the bottomed cylindrical portion 22.

Figure 4:
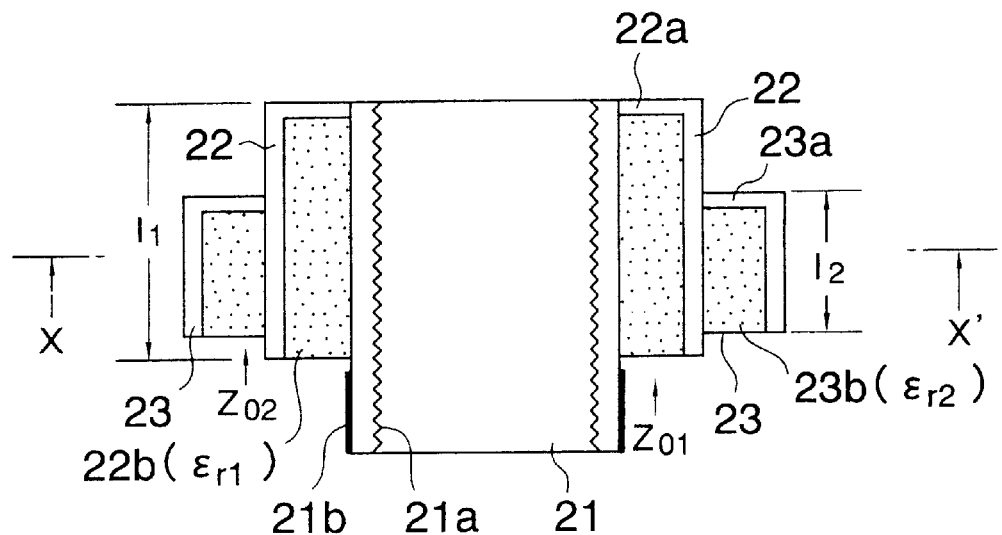
FIG. 4(a) and FIG. 4(b) are a sectional view showing a low-EMI cable connector according to an embodiment of the present invention.
Figure 4:
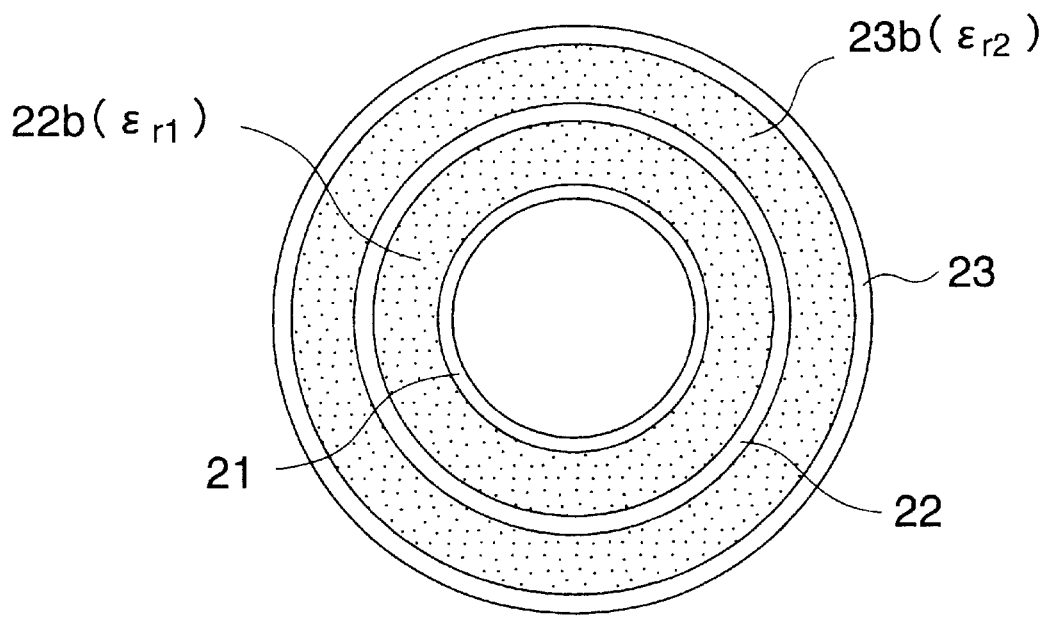
Figure 8:
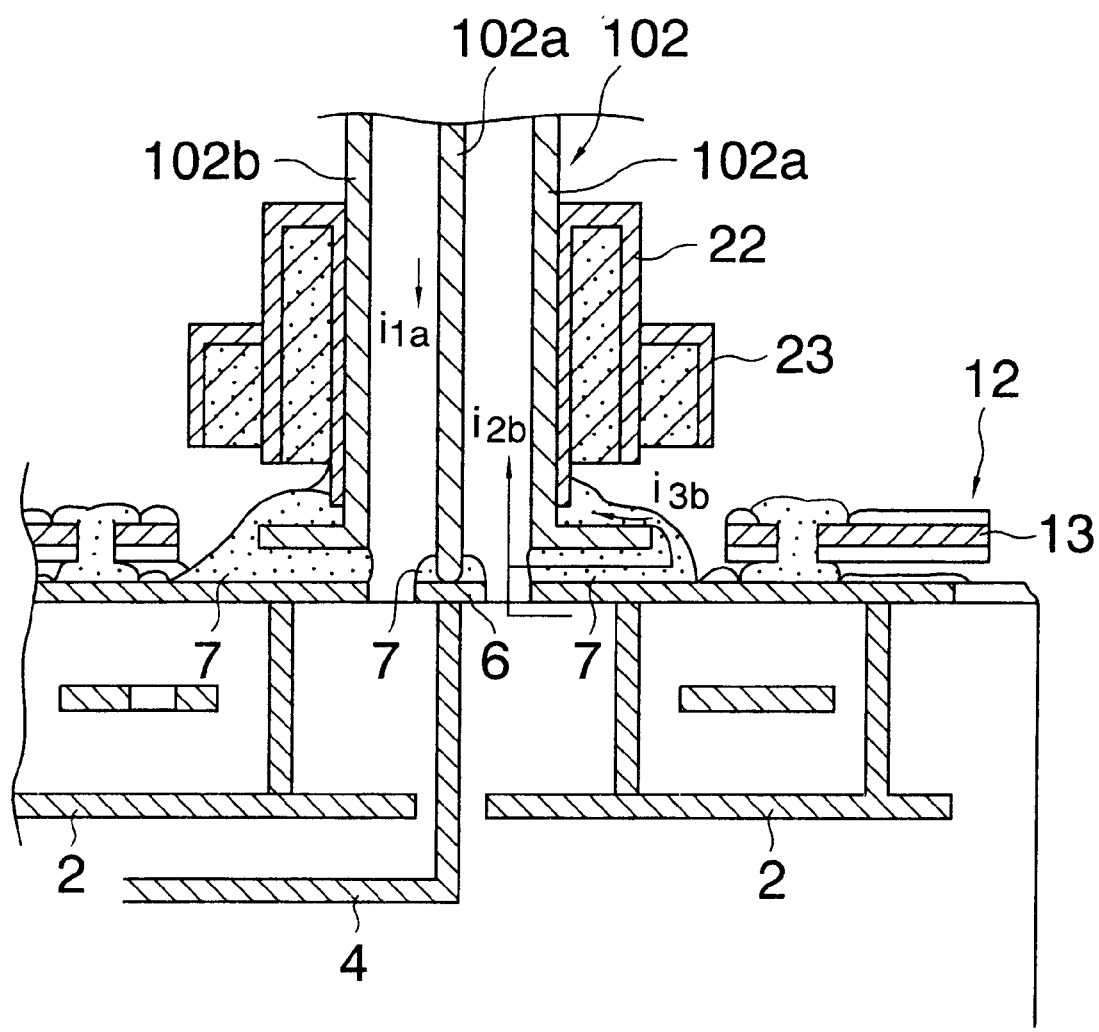
FIG. 8 is a sectional view showing the mounting and the operation on the low-EMI circuit board side of the low-EMI cable connector shown in FIG. 4.

FIG. 8 is a diagram showing the state in which the low-EMI cable connector shown in FIG. 4 is arranged at the end of the coaxial cable 102 nearer to the receiving terminal unit 101 (i.e. the low-EMI circuit board described with reference to FIGS. 1 to 3) in FIG. 13. The same component parts as the corresponding parts in the drawings are designated by the same reference numerals, respectively.

In the drawing, the coaxial cable 102 with the low-EMI cable connector mounted at an end thereof in the above-mentioned manner is connected to the input/output terminal of the low-EMI circuit board. In the process, the internal conductor 102a of the coaxial cable 102 is connected electrically by the solders 7 to the electrode pattern 6 arranged on the signal line layer 4 of the low-EMI circuit board. Also, the external conductor 102b of the coaxial cable 102, with the forward end thereof expanded, is connected electrically by the solders 7 to the ground layer 2 of the coaxial cable 102. In this case, the forward end of the external conductor 102b is not soldered in it entirety, but generally at multiple points, say, four points and is very difficult to hermetically seal.

With this configuration, the signal current i1b that has flowed in through the internal conductor 102a of the coaxial cable 102 flows into the signal line layer 4 of the low-EMI circuit board through the electrode pattern 6. The inward current i2b flowing along the inner surface of the ground layer 2, on the other hand, flows along the inner surface of the external conductor 102b of the coaxial cable 102. Since the external conductor 102b is soldered at, say, four points but not completely sealed, however, part of the inward current i2b leaks to the outer surface of the external conductor 102b from the gap not soldered of the external conductor 102b of the coaxial cable 102, and tends to flow along the outer surface of the external conductor 102b as a current i3b.

In contrast, a low-EMI cable connector is mounted at the joint between the coaxial cable 102 and the low-EMI circuit board, so that the leakage current i3b flows into his low-EMI cable connector. In the process, as in the case of FIG. 6, the leakage current i3b of a frequency causing the unrequired radiation in the coaxial cable 102 can be suppressed substantially to zero by setting the length of the bottomed cylindrical portions 22, 23 of the low-EMI cable connector appropriately and using a dielectric material of a proper dielectric constant for the bottomed cylindrical portions 22, 23.

Of course, the current flowing into the coaxial cable 102 from the low-EMI circuit board is not limited to the current flowing along the inner surface of the ground layer 2 but also includes the current flowing along the outer surface of the ground layer 2 arranged on the board surface and the current flowing along the surface of the conductive foil 13 of the shield plate 12. These currents partly leak out to the outer surface of the external conductor 102b of the coaxial cable 102 due to the presence of the gap caused by the multi-point connection between the forward end of the external conductor 102b of the coaxial cable 102 and the ground layer 2. The low-EMI cable connector functions effectively even against this leakage current as describe above.

In the embodiment shown in FIGS. 4 to 7, the low-EMI cable connector is configured in two stages having two bottomed cylindrical portions 22, 23. The unrequired radiation is generated by resonance of the coaxial cable 102 from the fundamental wave of the fundamental wave frequency f0 and odd-multiple high harmonics (2n−1)·f0 thereof. This can be prevented by increasing the impedance Z01 of the low-EMI cable connector to an infinitely large value for the fundamental frequency ω0 and odd multiples 3ω0, 5ω0, . . . , thereof, as shown by solid line in FIG. 5. From this point of view, the low-EMI cable connector having one-stage configuration having only the bottomed cylindrical portion 22 is sufficient in FIGS. 4 to 8.

In some cases, however, a connection equivalent to the connection to the ground line is obtained by providing a grounding line at an appropriate point of the external conductor 102b of the coaxial cable 102 or by bringing the external conductor 102b into contact with the ground. In such a case, not only the coaxial cable 102 itself but also the line including the part of the coaxial cable up to the connection point thereof with the ground line and the ground line resonates and generates the unrequired radiation at a frequency $2\omega 0$ twice as high as the fundamental frequency $\omega 0$. Then, as shown in FIGS. 4 to 8, the provision of a short-circuiting termination line including a bottomed cylindrical portion 23 with the impedance Z02 becoming infinitely large at the frequency $2\omega 0$ on the outside of the bottomed cylindrical portion 22 can suppress the generation of the unrequired radiation due to the resonance of the frequency $2\omega 0$.

Also, in the case where a plurality of coaxial cables are arranged in parallel, a single low-EMI cable connector can enclose them collectively and thus can simultaneously suppress the currents causing the unrequired radiation in the coaxial cables. In such a case, due to the difference of length, some coaxial cables may develop the resonance at the fundamental frequency $\omega 0$ and odd multiples thereof, and others at even multiples of the fundamental frequency $\omega 0$. In such a case, too, as shown in FIGS. 4 to 8, the low-EMI cable connector can be configured in two stages to prevent the unrequired radiation as a whole.

A similar effect is obtained for the cable in which a multiplicity of signal lines and ground lines are collectively shielded, for which a similar low-EMI cable connector can be used.

Figure 9:
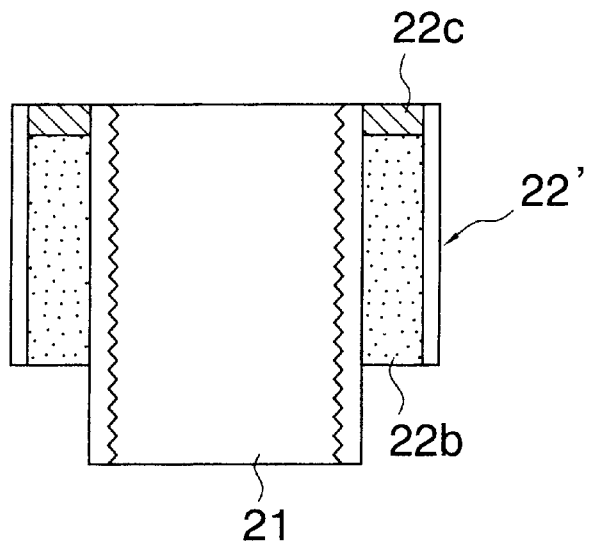
FIG. 9 is a sectional view showing a low-EMI cable connector according to another embodiment of the present invention.

FIG. 9 is a longitudinal sectional view showing a low-EMI cable connector according to a second embodiment of the preset invention. 22' designates a cylindrical portion, and 22c a matching termination resistor. The same component parts as the corresponding parts in the preceding drawings are designated by the same reference numerals, respectively.

In the drawing, this embodiment comprises the matching termination resistor 22c instead of arranging a short-circuiting termination in the depth of the unbottomed cylindrical portion 22'. The remaining configuration is similar to that of the embodiment described with reference to FIGS. 4 to 8.

According to this embodiment, the length of the cylindrical portion 22c is not important. Since the matching termination resistor 22c is provided in the line having the cylindrical portion 22' with the dielectric portion 22b, however, the leakage current flowing in this line is not reflected but flows to the matching termination resistor 22, at which it is converted into thermal energy, thereby suppressing the leakage current.

In similar fashion, in the embodiment of FIGS. 4 to 8, a slight gap in the short-circuiting termination portions 22a, 23a of the bottomed cylindrical portions 22, 23 may cause a current to leak from the gap and flow along the outer surface of the external conductor 102b of the coaxial cable 102. In view of this, a matching termination resistor compatible with the line including the bottomed cylindrical portions 22, 23 can be arranged in the short-circuiting termination portions 22a, 23a so that the current leaking from the gap can be thermally consumed by the matching termination resistor.

Figure 10:
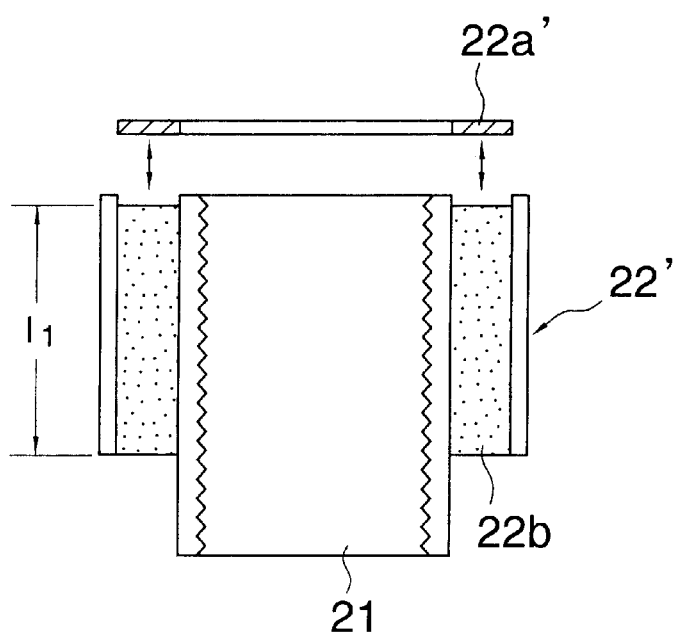
FIG. 10 is a sectional view showing a low-EMI cable connector according to still another embodiment of the present invention.

FIG. 10 is a longitudinal sectional view showing a low-EMI cable connector according to a third embodiment of the invention. 22a' designates a short-circuiting plate, and the same component parts as the corresponding parts in the preceding drawings are designated by the same reference numerals, respectively.

In the drawing, according to this embodiment, a lid-shaped short-circuiting plate 22a' of the cylindrical portion 22' is removable by screw or the like. In the case where the short-circuiting plate 22a' is mounted on the cylindrical section 22', like in the first embodiment shown in FIG. 4, the resonance occurs at the frequency f01 for the wavelength $\lambda 01$ satisfying the relation $l_1 = \lambda 01/4$ and frequencies corresponding to odd multiples thereof, and the impedance Z01 becomes infinitely large at these frequencies.

In the case where the short-circuiting plate 22a' is removed, on the other hand, an open end results, in which case the short-circuiting termination is constituted at the position one half the length $l_1$ of the cylindrical portion 22'. Thus, the impedance Z01' becomes infinitely large at a frequency satisfying the relation $$l_1/2 = \lambda 01'/4$$

This wavelength $\lambda 01'$ is one half of the wavelength $\lambda 01$ described above. When the short-circuiting plate 22a' is removed, therefore, a frequency twice as high as the resonance frequency with the short-circuiting plate 22' mounted prevails as a resonance frequency.

This removability of the short-circuiting plate 22a' makes it possible to use cables of two types of different clock frequencies. It is possible, therefore, to use the same low-EMI cable connector for both a cable with the clock frequency of 100 MHz and a cable with the clock frequency of 200 MHz.

Also this third embodiment, as shown in FIG. 4, can have a double-stage structure each with a removable short-circuiting plate.

Figure 11:
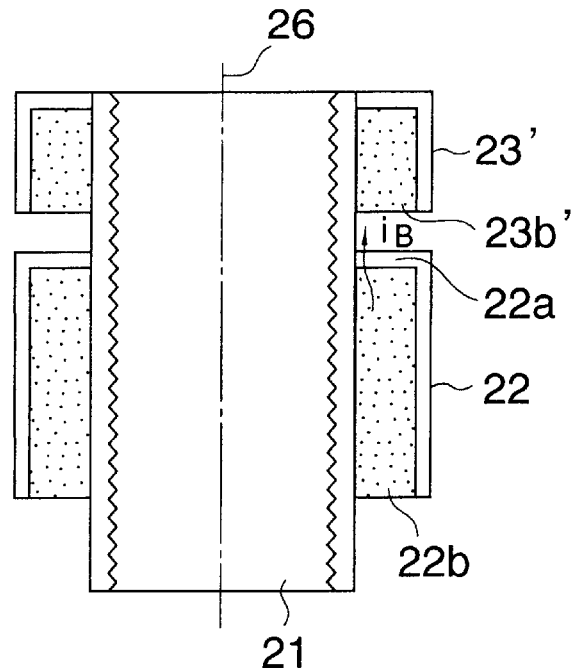
FIG. 11 is a sectional view showing a low-EMI cable connector according to a further embodiment of the present invention.

FIG. 11 is a longitudinal sectional view showing low-EMI cable connector according to a fourth embodiment of the present invention. 23' designates a bottomed cylindrical portion, 23b' a dielectric portion, and 26 center axis. The same component parts as the corresponding parts in the preceding drawings are designated by the same reference numerals, respectively.

In the foregoing embodiments, a plurality of bottomed cylindrical portions, if any, are arranged coaxially on the base cylindrical portion 21. According to the fourth embodiment, in contrast, as shown in FIG. 11, the bottomed cylindrical portions are arranged on the base cylindrical portion 21 along the center axis 26 thereof.

The bottomed cylindrical portion 22 resonates at the fundamental frequency f0 thereof and frequencies corresponding to odd multiples thereof. At the resonance frequencies, the impedance Z01 becomes substantially infinitely large. The bottomed cylindrical portion 23', on the other hand, resonates at a frequency twice as high as the resonance frequency of the bottomed cylindrical portion 22, at which the impedance Z02 becomes substantially infinitely large.

With this configuration, in addition to a similar effect to that of the first embodiment shown in FIGS. 4 to 8, the following effect is obtained. Specifically, even when the bottomed cylindrical portion 22 is electrically shorted by the short-circuiting termination portion 22a, the short-circuiting termination portion 22a may structurally have a gap.

Now, let the resonance frequency of the bottomed cylindrical portion 22 be fA (=(2n−1)·f0). The bottomed cylindrical portion 22 with the dielectric portion 22b built therein constitutes a short-circuiting termination line for the current of frequency fA. The current iB of a frequency different from the frequency fA of the current equal to the resonance frequency fB (=2fA) of the bottomed cylindrical portion 23' leaks out from the structural gap of the short-circuiting termination portion 22a of the bottomed cylindrical portion 22. With the low-EMI cable connector shown in FIG. 4, such a leakage current iB cannot be suppressed.

In the embodiment shown in FIG. 11, such a leakage current iB flows into the next bottomed cylindrical portion 23', where the current of frequency fB can be substantially suppressed to zero.

Figure 12:
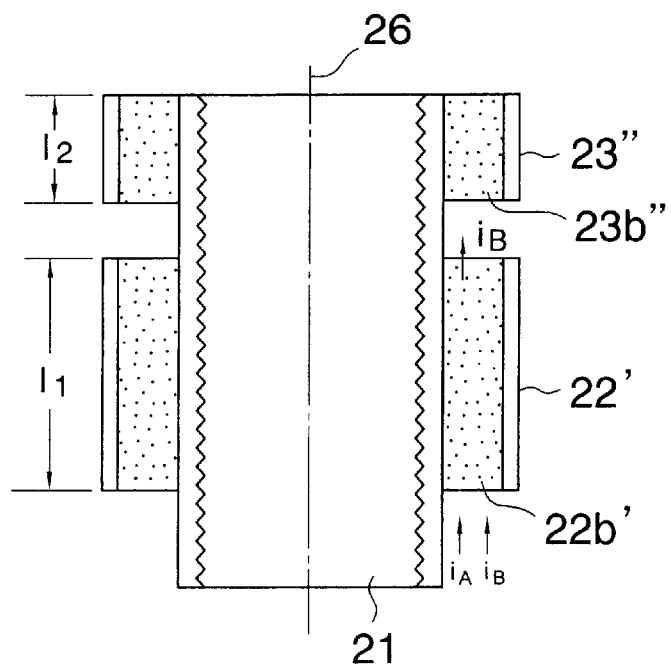
FIG. 12 is a sectional view showing a low-EMI cable connector according to a still further embodiment of the present invention.

FIG. 12 is a longitudinal sectional view showing a low-EMI cable connector according to a fifth embodiment of the invention. 22', 23" designate bottomed cylindrical portions, 22b', 23b" dielectric portions, and 26 a center axis. The same component parts as the corresponding parts in the preceding drawings are designated by the same reference numerals, respectively.

In this fifth embodiment, the cylindrical portions 22', 23" lacking the short-circuiting termination portion are arranged on the base cylindrical portion 21 along the center axis 26 thereof.

As explained with reference to FIG. 10, the transmission lines including the cylindrical portions 22', 23' with an open end, which are assumed to have the lengths of $l_1$, $l_2$, respectively, resonate at a frequency equal to odd multiples of the frequency fA' satisfying the relation $l_2/2=\lambda/4$ and at a frequency equal to odd multiples of the frequency fB' satisfying the relation $l_2/2=\lambda'/4$, respectively, at which the impedance becomes substantially infinitely large. Consequently, when the currents iA, iB of the frequencies fA', fB' flow into the cylindrical portion 22', the current iA of the frequency fA' is suppressed substantially to zero, while the current iB of the frequency fB' is passed directly through the cylindrical portion 22'.

The current iB that has passed through the cylindrical portion 22', however, is supplied to the cylindrical portion 23" where it is suppressed substantially to zero.

In this way, according to this embodiment, even in the case where the unrequired radiation of different frequencies fA', fB' is generated in the transmission path, the generation of the radiation of these frequencies can be effectively suppressed.

In the embodiments described above referring to the case, a coaxial cable is used as a transmission line. It is obvious, however, that the present invention is not limited to such a case.

INDUSTRIAL APPLICABILITY

As described above, in a low-EMI circuit board according to the present invention, a shield structure of high loss is formed of the low-EMI circuit board. As a result, the radiation of differential mode can be suppressed and removed, while at the same time effectively suppressing and removing the radiation of common mode due to the resonance current of high frequencies.

Also, the low-EMI cable connector according to the present invention, which is compact and light in weight and has a simple configuration, can highly effectively suppress the current generating the unrequired radiation from the cable, and therefore, as compared with the conventional version using a ferrite core, has a very great industrial effect of application.

What is claimed is:

1. A low-EMI cable connector mounted on a transmission cable for connecting units,
   comprising n (n: 1, 2, . . . ) cylindrical members having a dielectric portion arranged on the inner surface thereof for surrounding the whole periphery of said transmission cable,
   characterized in that a short-circuiting member for covering the whole periphery of said transmission cable is arranged on the termination side of said cylindrical member thereby to form a short-circuiting termination line, and
   the resonance frequency of said short-circuiting termination line is equal to the resonance frequency of said transmission cable.

2. A low-EMI cable connector as described in claim 1, characterized in that the length li of the i-th (i: 1, 2, . . . , n) one of said cylindrical members is given as $$l_i = \frac{1}{4} \times \frac{\lambda_i}{\sqrt{\varepsilon_{ri}}} \qquad \text{(Expression 1)}$$

where
$\lambda i = c/fi$
c=velocity of light
fi=i-th fundamental resonance frequency of said transmission cable, and
$\varepsilon ri$=dielectric constant of said dielectric portion of said i-th cylindrical member.

3. A low-EMI cable connector as described in claim 1 or 2,
   characterized in that a resistor having a matching termination resistance value is arranged on the termination side of said cylindrical member.

4. A low-EMI cable connector as described in claim 1 or 2,
   characterized in that a plurality of said cylindrical members are arranged coaxially.

5. A low-EMI cable connector as described in claim 1 or 2,
   characterized in that said short-circuiting member is removably configured.

6. A low-EMI cable connector as described in claim 1 or 2,
   characterized in that a plurality of said cylindrical members share the center axis and are arranged along said center axis.

7. A low-EMI cable connector as described in claim 1 or 2,
   characterized in that said cylindrical members are each adjustable in the position along the direction of the center axis.

8. A low-EMI cable connector mounted on a transmission cable for connecting units,
   comprising a cylindrical member with a dielectric portion arranged on the inner surface thereof and covering the whole periphery of said transmission cable,
   characterized in that a resistor constituting a matching termination resistor is provided on the termination side of said cylindrical member.

9. A low-EMI cable connector mounted on a transmission cable for connecting units,
   comprising n (n: 1, 2, . . . ) cylindrical members with a dielectric portion arranged on the inner surface thereof and covering the whole periphery of said transmission cable,
   characterized in that the termination side of said cylindrical members is an open end constituting an open termination line, and
   the resonance frequency of said open termination line is equal to the resonance frequency of said transmission cable.

10. A low-EMI cable connector as described in claim 9,
    characterized in that the length li of the i-th (i: 1, 2, . . . , n) one of said cylindrical members is given as $$\frac{l_t}{2} = \frac{1}{4} \times \frac{\lambda_i}{\sqrt{\varepsilon_{ri}}} \qquad \text{(Expression 2)}$$

where

λi=c/fi c=velocity of light fi=i-th fundamental resonance frequency of said transmission cable εri=dielectric constant of said dielectric portion of said i-th cylindrical member.

11. A low-EMI cable connector as described in claim 9 or 10, characterized in that a plurality of said cylindrical members share the center axis and are arranged along said center axis.

12. A low-EMI cable connector as described in claim 9 or 10, characterized in that said cylindrical members are each adjustable in the position along the direction of the center axis.

13. A low-EMI cable connector as described in any one of claims 2 and 10, characterized in that the dielectric constant of said dielectric portion is equal to or larger than about 300.

14. A low-EMI cable connector mounted on a transmission cable for connecting units, comprising:

a first cylindrical member having a dielectric portion arranged on the inner surface thereof for surrounding the transmission cable;

a second cylindrical member having a dielectric portion arranged on the inner surface thereof for disposition on the first cylindrical member;

a short-circuiting member for covering said transmission cable is arranged on the termination side of said first cylindrical member thereby to form a first short-circuiting termination line;

a second short-circuiting member for covering the first cylindrical member is arranged on the second cylindrical member thereby to form a second short-circuiting termination line; and a resonance frequency of said first short-circuiting termination line and a resonance frequency of said second short-circuiting termination line are different.

15. A low-EMI cable connector mounted on a transmission cable for connecting units, comprising:

a first cylindrical member having a dielectric portion arranged on the inner surface thereof and covering the transmission cable;

a second cylindrical member having a dielectric portion arranged on the inner surface thereof for disposition on the first cylindrical member;

a termination side of said first cylindrical member is an open end constituting a first open termination line;

a termination side of said second cylindrical member is an open end constituting a second open termination line; and a resonance frequency of said first open termination line and a resonance frequency of said second open termination line are different.

* * * * *